United States Patent
Chen et al.

(10) Patent No.: US 9,685,518 B2
(45) Date of Patent: Jun. 20, 2017

(54) METHOD OF FORMING SEMICONDUCTOR STRUCTURE OF CONTROL GATE, AND SEMICONDUCTOR DEVICE

(71) Applicant: TAIWAN SEMICONDUCTOR MANUFACTURING CO., LTD., Hsinchu (TW)

(72) Inventors: Chih-Ming Chen, Hsinchu (TW); Chin-Cheng Chang, New Taipei (TW); Szu-Yu Wang, Hsinchu (TW); Chung-Yi Yu, HsinChu (TW); Chia-Shiung Tsai, Hsin-Chu (TW); Ru-Liang Lee, Hsinchu (TW)

(73) Assignee: TAIWAN SEMICONDUCTOR MANFUCTURING CO., LTD., Hsinchu (TW)

( * ) Notice: Subject to any disclaimer, the term of this patent is extended or adjusted under 35 U.S.C. 154(b) by 104 days.

(21) Appl. No.: 14/079,186

(22) Filed: Nov. 13, 2013

(65) Prior Publication Data

US 2015/0129951 A1    May 14, 2015

(51) Int. Cl.
| | | |
|---|---|---|
| H01L 29/51 | (2006.01) | |
| H01L 29/423 | (2006.01) | |
| H01L 21/28 | (2006.01) | |
| H01L 29/66 | (2006.01) | |
| H01L 29/788 | (2006.01) | |

(52) U.S. Cl.
CPC .. *H01L 29/42332* (2013.01); *H01L 21/28273* (2013.01); *H01L 29/42328* (2013.01); *H01L 29/66825* (2013.01); *H01L 29/7881* (2013.01)

(58) Field of Classification Search
CPC . H01L 29/511; H01L 29/792; H01L 29/66833
USPC .......................................................... 257/324
See application file for complete search history.

(56) References Cited

U.S. PATENT DOCUMENTS

| | | | |
|---|---|---|---|
| 7,932,189 B2 | 4/2011 | Merchant et al. | |
| 2007/0020856 A1* | 1/2007 | Sadd | B82Y 10/00 438/270 |
| 2007/0066021 A1* | 3/2007 | Niimi | H01L 21/28202 438/287 |
| 2008/0176371 A1* | 7/2008 | Rao | B82Y 10/00 438/257 |

(Continued)

FOREIGN PATENT DOCUMENTS

| | | | | |
|---|---|---|---|---|
| DK | EP 1389799 A1 * | 2/2004 | ............. | B82Y 10/00 |

*Primary Examiner* — Kenneth Parker
*Assistant Examiner* — Warren H Kilpatrick
(74) *Attorney, Agent, or Firm* — McDermott Will & Emery LLP

(57) ABSTRACT

A method of forming a semiconductor structure of a control gate is provided, including depositing a first dielectric layer overlying a substrate, forming a surface modification layer from the first dielectric layer; and forming semiconductor dots on the surface modification layer. The surface modification layer has a bonding energy to the semiconductor dots less than the bonding energy between the first dielectric layer and the semiconductor dots. Therefore the semiconductor dots have higher density to form on the surface modification layer than that to directly form on the first dielectric layer. And a semiconductor device is also provided to tighten threshold voltage (Vt) and increase programming efficiency.

20 Claims, 5 Drawing Sheets

(56) References Cited

U.S. PATENT DOCUMENTS

2014/0209995 A1* 7/2014 Hong ............... H01L 29/42328
257/325

* cited by examiner

METHOD OF FORMING SEMICONDUCTOR STRUCTURE OF CONTROL GATE, AND SEMICONDUCTOR DEVICE

BACKGROUND

Field of Invention

The present invention relates to semiconductor devices. More particularly, the present invention relates to a semiconductor structure of a control gate.

Description of Related Art

In the family of nonvolatile memory devices, flash memory is an improved version of electrically erasable, programmable read-only memory (EEPROM). a split-gate nonvolatile memory (NVM) cell is provided typically is including two separating channel regions, controlled respectively by the floating gate and the control gate. Data is stored by modulating the threshold voltage (Vt) of the field effect transistor (FET) through hot carriers injection (HCI) through a dielectric layer into the charge storage element.

A split-gate thin film storage memory cell is a split-gate NVM cell having discontinuous charge storage elements like nanocrystal dots in a dielectric layer. The split-gate thin film storage memory cell has many benefits like simple operation, fast read access, lower power to read/write, and have simple fabrication process than the split-gate NVM cell. In order to continuously scale down the cell size, the split-gate thin film storage flash memory is proposed for embedded flash device. But the traditional charge storage elements formed by low pressure chemical vapor deposition (LPCVD) have their density limitation. When the split-gate NVM cell keeps scaling down, the effect of the charge storage elements density becomes significant. The density of the charge storage elements has directly connection with the threshold voltage, and low charge storage element density also brings poor program efficiency.

BRIEF DESCRIPTION OF THE DRAWINGS

Embodiments of the present disclosure are best understood from the following detailed description when read with the accompanying figures. It is to emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
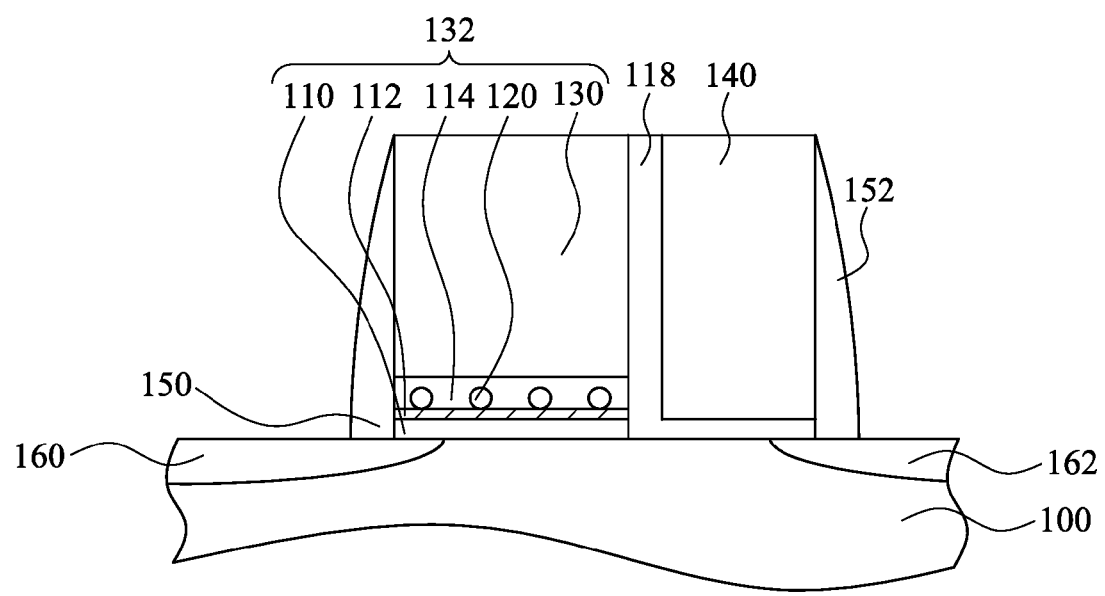
FIG. 1 is a cross-sectional view of a semiconductor device including a is semiconductor structure of a control gate according to one embodiment of the present disclosure.

FIG. 1 is a cross-sectional view of a semiconductor device including a semiconductor structure of a control gate according to various embodiments of the present disclosure. The semiconductor device, which is a split-gate thin film storage flash memory cell, includes a substrate 100 with a first doped region 160 and a second doped region 162, wherein the doped regions 160,162 can be a source/drain region for the memory cell, a control gate structure 132 on the substrate 100, a select gate electrode 140 adjacent to the control gate structure 132, a third dielectric layer 118 between the control gate structure 132 and the select gate electrode 140, and between the select gate electrode 140 and the substrate 100, two sidewall spacers 150,152 located on the substrate 100 adjacent to the control gate structure 132 and the select gate electrode 140, respectively. The control gate structure 132 includes a first dielectric layer 110 over the substrate 100, a surface modification layer 112 over the first dielectric layer 110, semiconductor dots 120 on the surface modification layer 112, a second dielectric layer 114 overlying the semiconductor dots 120, a control gate electrode 130 overlying the second dielectric layer 114.

According to various embodiments of the present disclosure, the substrate 100 is a silicon substrate. In another embodiment, the substrate 100 includes an integrated circuit or a semiconductor device. The control gate structure 132 and select gate electrode 140 includes polysilicon or metal. The dielectric layers 110,114 include silicon oxide or high-k dielectric material. The surface modification layer 112 includes carbon or nitrogen as a residue of the surface modification process to form higher density semiconductor dots 120, where the higher density is in contrast to the semiconductor device without surface modification, about $2\mathrm{e}11/\mathrm{cm}^2$. In various embodiments of the present disclosure, the semiconductor dots 120 density is $6\mathrm{e}11/\mathrm{cm}^2$. In another embodiment of the present disclosure, the semiconductor dots 120 density can be $9\mathrm{e}11/\mathrm{cm}^2$ or even higher. In embodiments, the semiconductor dots 120 include nanosilicon dots. In embodiments, the sidewall spacers 150,152 include silicon dioxide.

Figure 2:
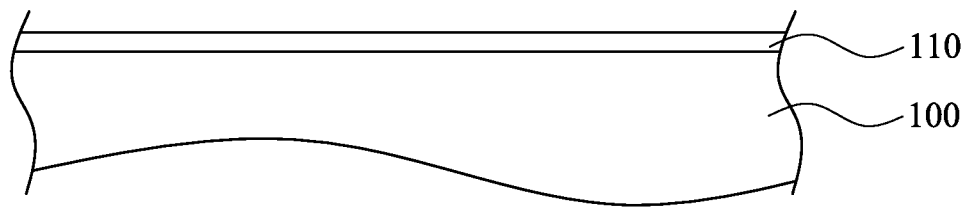
FIGS. 2-5 are cross-sectional views at various stages of manufacturing a semiconductor structure of a control gate according to one embodiment of the present disclosure.

FIGS. 2-5 are cross-sectional views at various stages of manufacturing a semiconductor structure of a control gate according to various embodiments of the present disclosure. Referring to FIG. 2, a substrate 100 is provided. Substrate 100 includes a semiconductor material like silicon, germanium, carbon, another semiconductor material as an III-V or II-VI material, or combinations thereof. In another embodiment of present disclosure, the is substrate 100 can include other types of semiconductor devices, such as a semiconductor on sapphire, a semiconductor on insulator, integrated circuit, or another semiconductor substrate. In various embodiments of the present disclosure, the substrate includes monocrystalline silicon.

A first dielectric layer 110 is deposited overlying the substrate 100. In embodiments of the present disclosure, the first dielectric layer 110 is a tunnel dielectric layer, where the thickness is smaller than 100 Angstroms. The first dielectric layer 110 includes an oxide, a nitride, an oxynitride, a high-k dielectric material, or combinations thereof. The first dielectric layer 110 may be deposited using low pressure chemical vapor deposition (LPCVD). In various embodiments of the present disclosure, the first dielectric layer includes a silicon dioxide.

Figure 3:
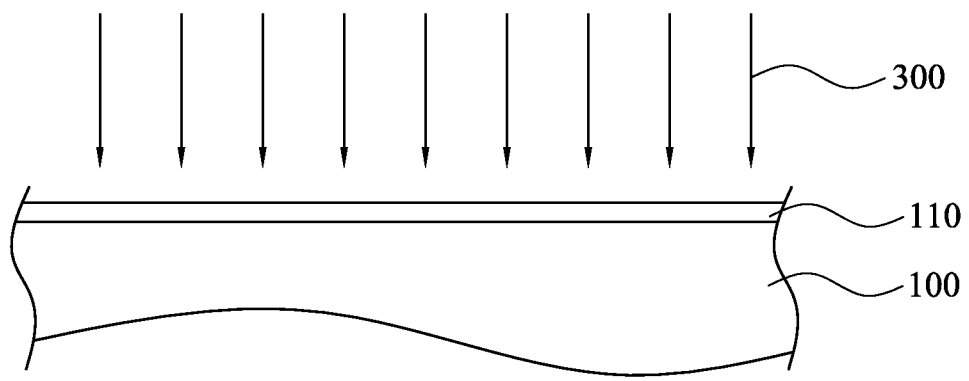

Referring to FIG. 3, FIG. 3 illustrates a surface modification process 300 to form a surface modification layer from the first dielectric layer 110. The surface modification process 300 can be a plasma treatment or an ion implantation to the first dielectric layer 110. In various embodiments of the present disclosure, the surface modification process 300 is a plasma treatment to a surface of the first dielectric layer, the plasma treatment using $N_2$, $N_2O$, NO, $NH_3$, CO, $CO_2$, or combinations thereof. In another embodiment of the present disclosure, the surface modification process 300 is implanting ions into the first dielectric layer 110, than annealing the first dielectric layer so as to form the surface modification layer from the first dielectric layer. In which the implanting ion is nitrogen or carbon. In various embodiments of the present disclosure, the energy for implanting nitrogen or carbon is less than 10 KeV; in embodiments, the dose of implanting nitrogen or carbon is larger than 1E12 atoms/$cm^2$.

Figure 4:
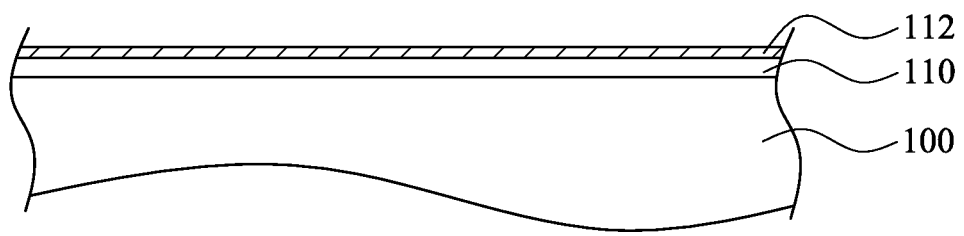

Referring to FIG. 4, it is illustrated the cross-sectional view of the semiconductor structure of a control gate after the surface modification process 300 according to various embodiments of the present disclosure. A surface modification layer 112 is formed from the first dielectric layer 110 after the surface modification process 300, where the surface modification layer 112 includes the same material with the first dielectric layer 110 and carbon or nitrogen to make a bonding energy between the semiconductor dots and the surface modification layer 112 less than the bonding energy between the first dielectric layer 110 and the semiconductor dots.

Figure 5:
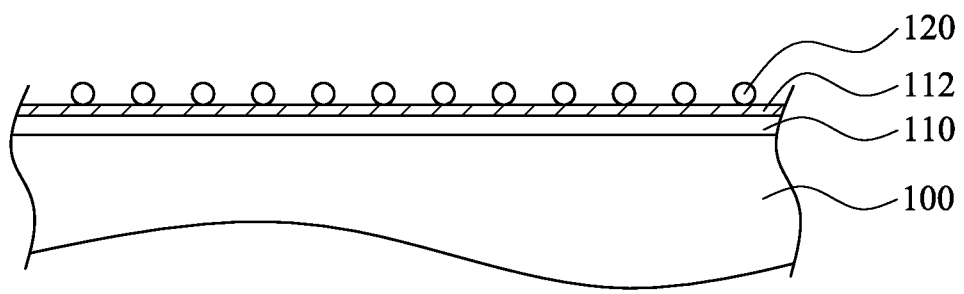

Referring to FIG. 5, semiconductor dots 120 is formed on the surface modification layer 112 according to embodiments of the present disclosure. The semiconductor dots 120 serve as a charge storage region of a memory device, and the semiconductor dots 120 can include silicon nanocrystal dots, metal nanoclusters, or any combinations thereof. In various embodiments of the present disclosure, the semiconductor dots can be silicon nanocrystal dots formed by forming a continuous amorphous silicon layer first, than exposing the layer to heat to cause the layer to "ball up" to form discontinuous silicon nanocrystal dots. In various embodiments of the present disclosure, the to semiconductor dots can be deposited by sputtering or LPCVD. In another embodiment of the present disclosure, the semiconductor dots can be undoped, doped during deposition, or doped after deposition.

In various embodiments of the present disclosure, the semiconductor dots 120 includes silicon, the first dielectric layer 110 includes silicon dioxide and the surface modification layer 112 includes carbon, using the bonding energy of silicon-carbon, about 78 Kcal/mol, to replace the bonding energy of silicon-oxygen, about 106 Kcal/mol. In another embodiment the surface modification layer 112 includes nitrogen, where the bonding energy of silicon-nitrogen is about 80 Kcal/mol. Which makes silicon nanocrystal dots much easier to form on the surface modification layer 112 than on the first dielectric layer 110. Also, when the silicon nanocrystal dots forming on the surface modification layer 112, the bonding energy has silicon-silicon, about 53 Kcal/mol, and silicon-carbon, about 78 Kcal/mol. In contrast with the silicon nanocrystal dots forming on the first dielectric layer 110, the bonding energy has silicon-silicon, about 53 Kcal/mol, and silicon-oxygen, about 106 Kcal/mol. The difference of the bonding energy between silicon-silicon and silicon-carbon is smaller than silicon-silicon and silicon-oxygen, thus can form the silicon nanocrystal dots with the uniformity of the size, and have a higher density of the silicon nanocrystal dots.

In various embodiments of the present disclosure, provided a method of forming a semiconductor structure of a control gate includes depositing a first dielectric layer overlying the substrate, forming a surface modification layer from the first dielectric layer, and forming semiconductor dots on the surface modification layer, wherein the surface modification layer has a bonding energy to the semiconductor dots less than a bonding energy between the first dielectric layer and the semiconductor dots. In various embodiments of the present disclosure, forming a surface modification layer is conducted by forming a nitrogen rich layer from the first dielectric layer, forming a carbon rich layer from the first dielectric layer, processing a plasma treatment to a surface of the first dielectric layer, or implanting ions into the first dielectric layer followed annealing the first dielectric layer, so as to form the surface modification layer from the first dielectric layer.

Figure 6:
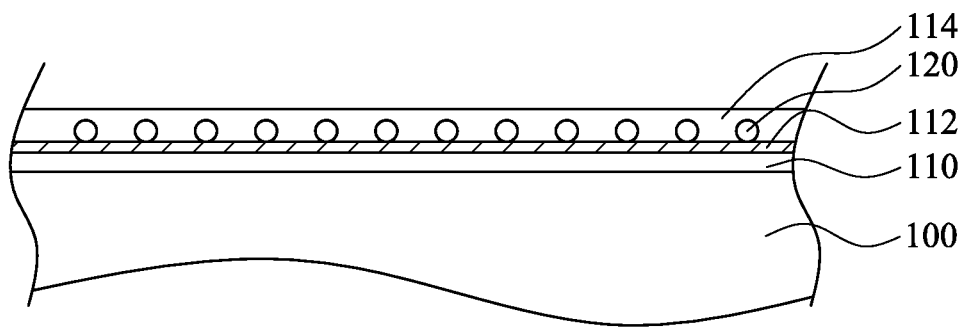
FIGS. 6-9 are cross-sectional views at various stages of manufacturing a semiconductor device according to another embodiment of the present disclosure.

FIGS. 6-9 are cross-sectional views at stages of manufacturing a semiconductor device according to another embodiment of the present disclosure. Referring to FIG. 6, in embodiments, the semiconductor device is a split-gate thin film storage flash memory cell; the method of manufacturing the memory cell also includes the process illustrated in FIG. 1 through FIG. 5. FIG. 6 illustrates a second dielectric layer 114 overlying the semiconductor dots 120 and the surface modification layer 112. The dielectric layer 114 can insulate the semiconductor dots 120 from the subsequently formed control gate electrode. The second dielectric layer 114 can include a material previously described with respect to the first dielectric layer 110. In various embodiments of the present disclosure, the second dielectric layer 114 includes silicon dioxide, and deposition with a high temperature oxidation (HTO) process.

Figure 7:
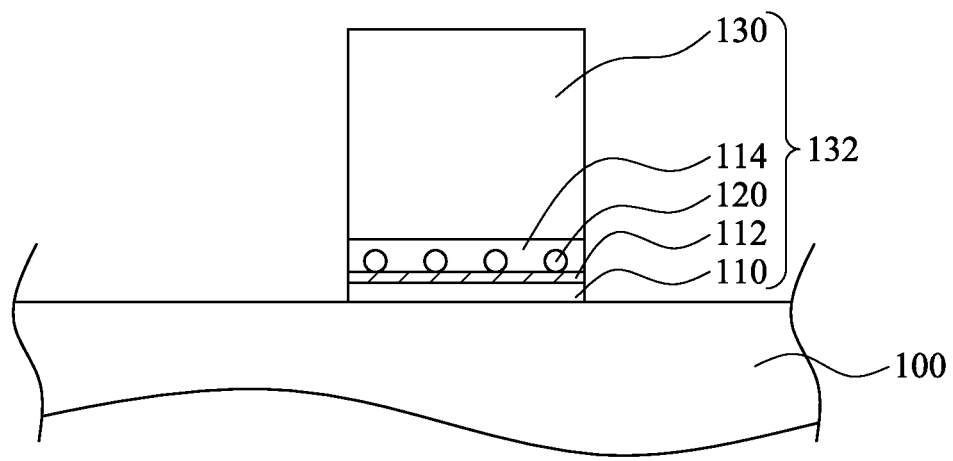

FIG. 7 illustrates a control gate electrode 130 overlying the second dielectric layer 114, and forms a control gate structure 132. A conductive layer (not illustrated) is deposited over the second dielectric layer 114 and is then patterned and etched to form the control gate electrode 130 and the control gate structure 132. The control gate electrode 130 includes a conductive to material as a metal, metal alloy, ploysilicon, or combinations thereof. The control gate electrode 130 can be formed by physical vapor deposition (PVD), chemical vapor deposition (CVD), atomic layer deposition (ALD) process, or combinations thereof followed by a lithographic process. The control gate structure 132 includes a first dielectric layer 110 over the substrate 100, a is surface modification layer 112 over the first dielectric layer 110, semiconductor dots 120 on the surface modification layer 112, a second dielectric layer 114 overlying the semiconductor dots 120, and a control gate electrode 130 overlying the second dielectric layer 114.

Figure 8:
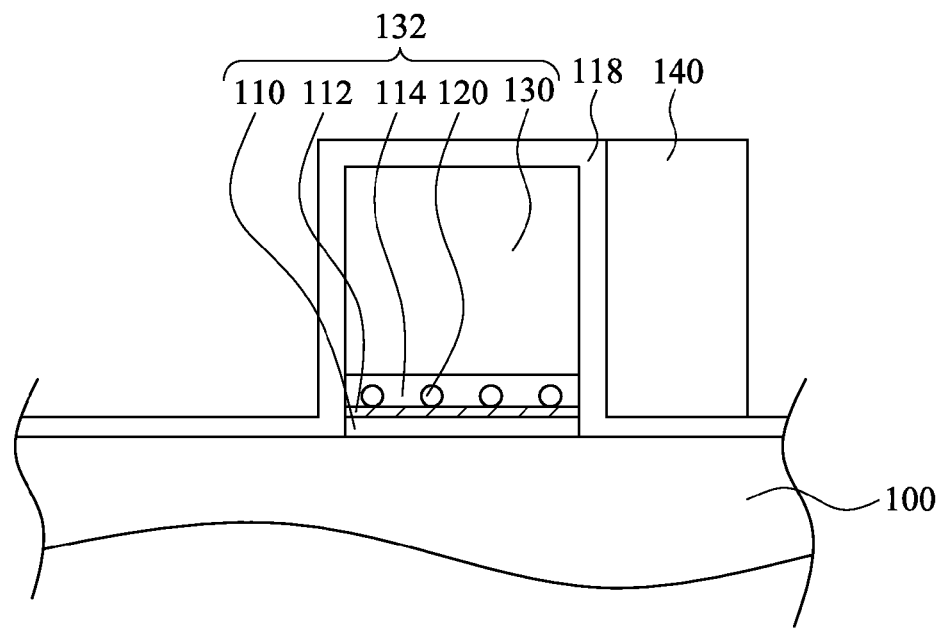

Referring to FIG. 8, it illustrates a third dielectric layer 118 overlying the control gate structure 132 and the substrate 100, and a select gate electrode 140 on the third dielectric layer 118 adjacent to the control gate structure 132. The third dielectric layer 118 deposited over the control gate structure 132 and the substrate 100 followed by depositing a conductive layer (not illustrated) over the third dielectric layer 114 and then patterned and etched to form the select gate electrode 140. The select gate electrode 140 can include a material previously described with respect to the control gate electrode 130.

Figure 9:
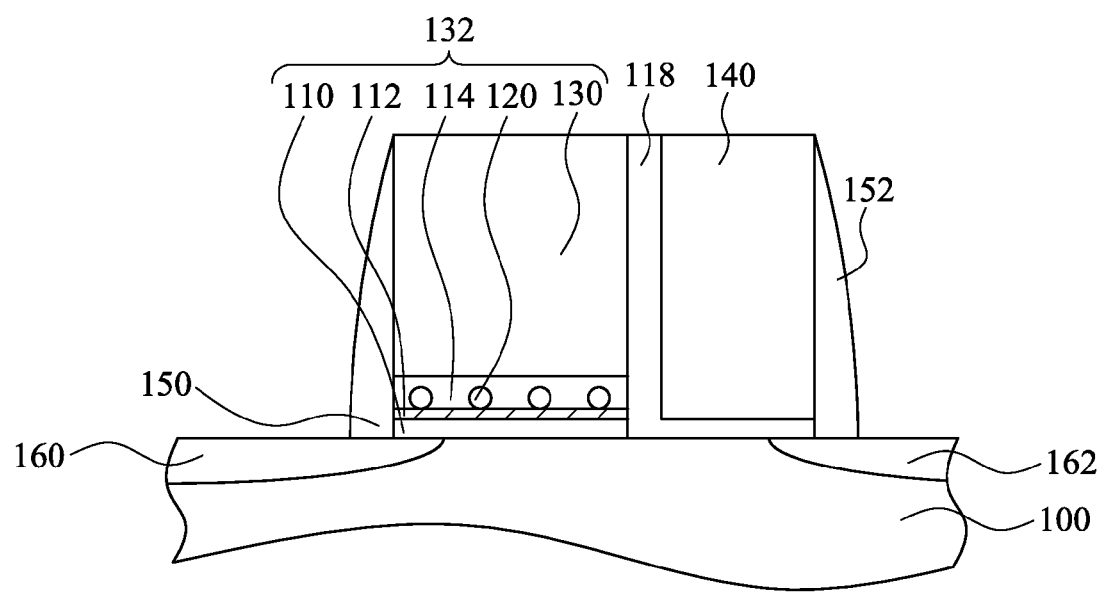

Referring to FIG. 9, FIG. 9 illustrates a split-gate thin film storage flash memory cell according to various embodiments of the present disclosure. In the illustration, the third dielectric layer 118 is patterned and etched, two sidewall spacers 150,152 are formed, located on the substrate adjacent to the control gate structure 132 and the select gate electrode 140, the substrate 100 is doped with a first doped region 160 and a second doped region 162, where the doped regions 160, 162 can be a source/drain region for the memory cell. The two sidewall spacers 150,152 includes a material previously described with respect to the first dielectric layer 110, and formed by following deposition, patterning and etching process.

Thus, in various embodiments of the present disclosure, a method of forming a semiconductor device includes providing a substrate 100, depositing a first dielectric layer 110 overlying the substrate 100, forming a surface modification layer 112 from the first dielectric layer 110, forming semiconductor dots 120 on the surface modification layer 112, depositing a second dielectric layer 114 overlying the semiconductor dots 120, depositing a control gate electrode 130 overlying the second dielectric layer 114, depositing a third dielectric layer 118 overlying the control gate structure 132 and the substrate 100, forming a select gate electrode 140 adjacent to the control structure 132, forming two sidewall spacers 150,152 respectively adjacent to the control gate structure 132 and the select gate electrode 140, and forming two doped regions 160,162 individually next to one of the side wall spacers 150,152 in the substrate 100. Wherein, the process of forming a surface modification layer makes the semiconductor dots easier to form on the surface modification layer and have higher density and much uniform size than forming directly on the first dielectric layer.

In various embodiments of the present disclosure, the split-gate thin film storage flash memory cell illustrated in FIG. 9 is formed by forming a control gate structure first followed by forming a select gate as illustrated in FIG. 2-9. The split-gate thin film storage flash memory cell illustrated in FIG. 9 can also be formed in a select gate electrode first way as providing a substrate 100 already formed a third dielectric layer 118 and a select gate electrode 140 by the previously described way followed by forming the control gate structure 132 next to the third dielectric layer 118, than forming two sidewall spacers 150,152 respectively adjacent to the control gate structure 132 and the select gate electrode 140, and forming two doped regions 160,162 individually next to one of the side wall spacers 150,152 in the substrate 100.

In another embodiment of the present disclosure, a semiconductor device includes a substrate having a source doped region and a drain doped region, a control gate structure on the substrate and between the source and drain doped regions, a select gate electrode adjacent to the control gate structure, a third dielectric layer between the control gate structure and the select gate electrode, and between the select gate electrode and the substrate, and two sidewall spacers located on the substrate respectively adjacent to the control gate electrode and the select gate electrode. The control gate structure on the substrate includes a first dielectric layer over the substrate, a surface modification layer over the first dielectric layer, the surface modification layer having carbon or nitrogen, semiconductor dots on the surface modification layer, a second dielectric layer overlying the semiconductor dots, and a control gate electrode overlying the second dielectric layer. In various embodiments, the semiconductor device is a split-gate thin film storage embedded flash memory cell. Because of the surface modification layer exists, the density of semiconductor dots are much higher than the split thin film storage memory cell without the surface modification layer, the higher semiconductor dots density tighten the Vt distribution, and improves the program efficiency of the split-gate thin film storage embedded flash memory cell.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of forming a semiconductor device, comprising:
   depositing a first dielectric layer overlying a substrate;
   treating the first dielectric layer to form a surface modification layer;
   forming semiconductor dots on the surface modification layer of the first dielectric layer, wherein a bonding energy between the semiconductor dots and the surface modification layer is less than a bonding energy between the first dielectric layer and the semiconductor dots;
   forming a control gate electrode over the semiconductor dots;
   forming a second dielectric layer along a sidewall of the control gate electrode and a portion of the substrate; and
   forming a select gate electrode at an inside corner of the second dielectric layer.

2. The method of claim 1, wherein treating the first dielectric layer to form the surface modification layer is conducted by treating the first dielectric layer with nitrogen to form a nitrogen rich layer.

3. The method of claim 1, wherein treating the first dielectric layer to form the surface modification layer is conducted by treating the first dielectric layer with carbon to form a carbon rich layer.

4. The method of claim 1, wherein treating the first dielectric layer to form the surface modification layer is conducted by processing a plasma treatment to a surface of the first dielectric layer.

5. The method of claim 4, wherein processing the plasma treatment is conducted with $N_2$, $N_2O$, NO, $NH_3$, CO, $CO_2$ or combinations thereof.

6. The method of claim 1, wherein treating the first dielectric layer to form the surface modification layer further comprising:
- implanting ions into the first dielectric layer; and
- annealing the first dielectric layer, so as to form the surface modification layer from the first dielectric layer.

7. The method of claim 6, wherein implanting the ions is implanting nitrogen or carbon ions into the first dielectric layer.

8. The method of claim 1, wherein the first dielectric layer comprises silicon dioxide.

9. The method of claim 1, wherein the semiconductor dots comprises silicon nanocrystal dots.

10. A method of forming a semiconductor device comprising:
- providing a substrate;
- forming a control gate structure, comprising:
  - depositing a first dielectric layer overlying the substrate;
  - treating the first dielectric layer to form a surface modification layer;
  - forming a continuous amorphous silicon layer on the surface modification layer of the first dielectric layer; and exposing the continuous amorphous silicon layer to heat to transform the continuous amorphous silicon layer into a plurality of discrete silicon nanocrystal dots;
  - depositing a second dielectric layer overlying the semiconductor dots; and
  - depositing a control gate electrode overlying the second dielectric layer;
- depositing a third dielectric layer along a sidewall of the control gate electrode and a portion of the substrate;
- forming a select gate electrode on the substrate that is covered by the third dielectric layer, wherein the select gate electrode physically contacts a portion of the third dielectric layer that disposed along the sidewall of the control gate electrode;
- forming two sidewall spacers respectively adjacent to the control gate structure and the select electrode; and
- forming two doped regions individually next to one of the sidewall spacers in the substrate.

11. The method of claim 10, wherein depositing the second dielectric layer overlying the semiconductor dots is conducted by a high temperature oxidation (HTO).

12. The method of claim 10, wherein treating the first dielectric layer to form the surface modification layer is conducted by processing a plasma treatment to a surface of the first dielectric layer.

13. The method of claim 12, wherein processing the plasma treatment is conducted with $N_2$, $N_2O$, NO, $NH_3$, CO, $CO_2$ or combinations thereof.

14. The method of claim 10, wherein treating the first dielectric layer to form the surface modification layer in forming the control gate structure further comprising:
- implanting ions into the first dielectric layer; and
- annealing the first dielectric layer, so as to form the surface modification layer from the first dielectric layer.

15. The method of claim 14, wherein implanting the ions is implanting nitrogen or carbon ions into the first dielectric layer.

16. A semiconductor device comprising:
- a substrate having a source doped region and a drain doped region;
- a control gate structure on the substrate and between the source and drain doped regions, comprising:
  - a first dielectric layer disposed over the substrate and having a surface modification layer;
  - semiconductor dots on the surface modification layer, wherein the semiconductor dots has a density of about $2\times10^{11}/cm^2$ to about $9\times10^{11}/cm^2$;
  - a second dielectric layer overlying the semiconductor dots; and
  - a control gate electrode overlying the second dielectric layer;
- a third dielectric layer disposed along a sidewall of the control gate electrode and a portion of the substrate;
- a select gate electrode disposed on the portion of the substrate that is covered by the third dielectric layer, wherein the select gate electrode physically contacts a portion of the third dielectric layer that disposed along the sidewall of the control gate electrode; and
- two sidewall spacers located on the substrate respectively adjacent to the control gate electrode and the select gate electrode.

17. The device of claim 16, wherein the dielectric layers comprising silicon dioxide.

18. The device of claim 16, wherein the surface modification layer comprises carbon or nitrogen.

19. The device of claim 16, wherein the semiconductor dots comprise silicon nanocrystal dots.

20. The device of claim 16, wherein the gate electrode comprise polysilicon or metal.

* * * * *